(12) United States Patent
Ohata et al.

(10) Patent No.: US 6,320,543 B1
(45) Date of Patent: Nov. 20, 2001

(54) MICROWAVE AND MILLIMETER WAVE CIRCUIT APPARATUS

(75) Inventors: Keiichi Ohata; Kenichi Maruhashi; Masaharu Ito, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/528,061

(22) Filed: Mar. 17, 2000

(30) Foreign Application Priority Data

Mar. 24, 1999 (JP) .................................................. 11-080621

(51) Int. Cl.$^7$ ........................................................ H01Q 1/38
(52) U.S. Cl. .................................. 343/700 MS; 343/846
(58) Field of Search .......................... 343/700 MS, 873, 343/846, 848; 361/748; 333/247; H01Q 1/38

(56) References Cited

U.S. PATENT DOCUMENTS 5,903,239 * 5/1999 Takahashi et al. ............ 343/700 MS
6,018,299 * 1/2000 Eberhardt ..................... 343/700 MS

* cited by examiner

*Primary Examiner*—Hoanganh Le
(74) *Attorney, Agent, or Firm*—Hutchins, Wheeler & Dittmar

(57) ABSTRACT

The present invention provides a microwave and millimeter wave circuit apparatus having a reduced size and which can be produced easily, improving productivity. The microwave and millimeter wave circuit apparatus includes: a grounding conductive layer 4 grounded; a first dielectric layer 5 formed on this grounding conductive layer 4; a signal line selectively formed on this first dielectric layer 5; a second dielectric layer 7 covering at least a portion of the signal line 6; a cavity 2 formed in this second dielectric layer 7 and extending to the signal line 6; a monolithic microwave integrated circuit 1 arranged in the cavity 2 and connected to the signal line 6; and an antenna connected to the signal line 6.

19 Claims, 8 Drawing Sheets

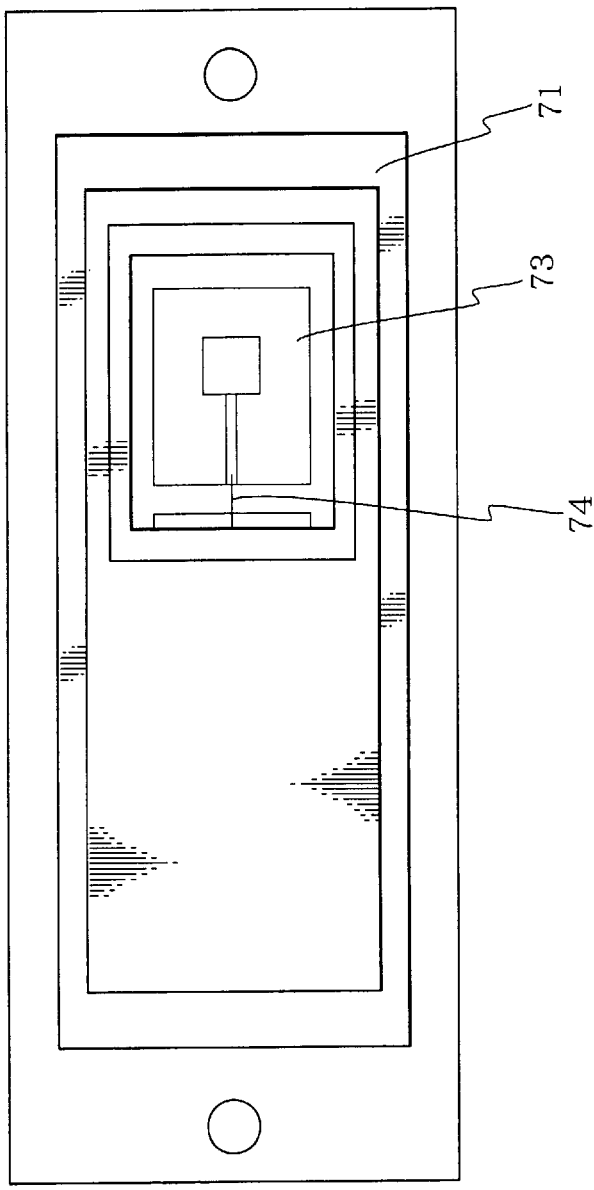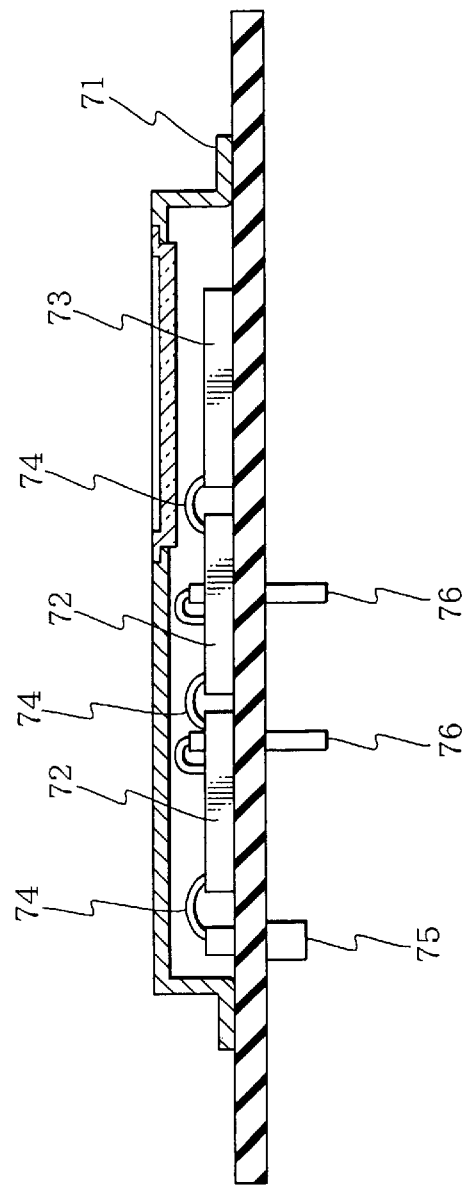
FIG.7(a)
FIG.7(b)

MICROWAVE AND MILLIMETER WAVE CIRCUIT APPARATUS

BACKGROUND OF THE INVENTION

1. Field of the Invention

The present invention relates to a microwave and millimeter wave circuit apparatus used as a high-frequency module for a communication apparatus, radar, or the like and in more particular, to a microwave and millimeter wave circuit apparatus capable of reducing a transmission loss.

2. Description of the Related Art

In order to reduce the size of the microwave and millimeter wave circuit apparatus and perform mass production thereof, it is effective to prepare transmitter and receiver circuits of the microwave and millimeter wave as a multi-chip module (MCM) and make this transmitter and receiver circuits, which is the multi-chip module, as an integration block with an antenna. FIG. 7 schematically shows a microwave and millimeter wave circuit apparatus conventionally suggested as an integration module having an antenna.

In this conventional microwave and millimeter wave circuit apparatus, a metal case package 71 contains a monolithic microwave integrated circuit (MMIC) 72 and an antenna substrate 73 which are connected to each other by a bonding wire 74. Moreover, an intermediate frequency (IF) terminal 75 and a bias terminal 76 are connected to the MMIC 72 via a bonding wire 74. Moreover, an attempt has been made to prepare a microwave and millimeter wave circuit apparatus using a GaAs substrate. FIG. 8 schematically shows a conventional microwave and millimeter wave circuit apparatus using a GaAs substrate.

An MMIC substrate 81 has a receiver integrated circuit 81a formed on the GaAs substrate. Moreover, in an antenna substrate 82, a patch antenna 85 is provided on a quartz substrate. On the surface of the antenna substrate 82, a grounding metal cover 83 and a coupling slot 84 are formed. The MMIC substrate 81 and the antenna substrate 82 are bonded to each other, so that the circuit in the MMIC substrate 81 and the antenna 85 are connected to each other via the coupling slot 84.

However, in the conventional microwave and millimeter wave circuit apparatus shown in FIG. 7, the MMIC 72 and the antenna substrate 73 are only connected to each other only the wire bonding 74 and are contained in the package 71 in an airtight way. Accordingly, there is a limit to reduction in size and mass production. Especially in the millimeter wave circuit, there is a problem that because of parasitic elements such as inductance caused by the wire bonding 74, it is difficult to perform connections with a low loss and to assure performance repeatability. Furthermore, the patch antenna is connected to the RF circuit such as the MMIC on a plane-to-plane basis and a long feed line to the patch antenna is required. It is necessary to reduce the loss in the feed line. Moreover, in the conventional microwave and millimeter wave circuit apparatus shown in FIG. 8, there is a problem that it is necessary to accurately position the MMIC substrate 81 and the antenna substrate 82, complicating the assembling process. Furthermore, since circuit elements are provided on the upper and the lower surface of the apparatus, there is a problem that when mounted on a stage it is impossible to measure microwave and millimeter wave characteristics using a probe apparatus or the like.

SUMMARY OF THE INVENTION

It is therefore an object of the present invention to provide a microwave and millimeter wave circuit apparatus which can easily be produced and is capable of reducing the entire size and improving productivity.

The microwave and millimeter wave circuit apparatus according to the present invention comprises: grounding conductive layer grounded; a first dielectric layer formed on the grounding conductive layer; a signal line formed selectively on the first dielectric layer; a second dielectric layer covering at least a part of the signal line; a cavity formed in this second dielectric layer and extending to the signal line; a monolithic microwave integrated circuit arranged in the cavity and connected to the signal line; and an antenna connected to the signal line.

In the present invention, the microwave and millimeter wave circuit apparatus may further comprise two second grounding conductive layers formed so as to sandwich the signal line on the first dielectric layer and grounded, wherein the signal line and the two grounding conductive layer constitute a coplanar line.

Moreover, the first dielectric layer may have a thickness smaller than a value obtained by $c/(4f \cdot (\in_{r_1}-1)^{1/2})$ wherein $\in_{r_1}$ is a relative dielectric constant of the first dielectric layer, f is a frequency of the signal propagating in the signal line, and c is a light velocity, and the second dielectric layer may have a thickness smaller than a value obtained by $c/(4f \cdot (\in_{r_2}-1)^{1/2})$ wherein $\in_{r_2}$ is a relative dielectric constant of the second dielectric layer, f is a frequency of the signal propagating in the signal line, and c is a light velocity.

Moreover, the monolithic microwave integrated circuit may be flip-chip mounted. Furthermore, a groove may be formed in the first dielectric layer, and the first dielectric layer in the region of the groove may have a thickness smaller than a value obtained from equation $c/(4f(\in_{r_1}-1)^{1/2})$ wherein $\in_{r_1}$ is a relative dielectric constant of the first dielectric layer, f is the maximum frequency of the signal propagating in the signal line, and c is the light velocity.

Furthermore, a second groove may be formed in the second dielectric layer, and the second dielectric layer in the region of the second groove may have a thickness smaller than a value obtained from equation $c/(4f(\in_{r_2}-1)^{1/2})$ wherein $\in_{r_2}$ is a relative dielectric constant of the second dielectric layer, f is the maximum frequency of the signal propagating in the signal line, and c is the light velocity.

Moreover, the microwave and millimeter wave circuit apparatus may further comprise a via hole buried in the first dielectric layer and connected to the grounding conductive layer and to the second grounding conductive layer.

Furthermore, the second dielectric layer may have at least a portion where no metal cover is provided. The microwave and millimeter wave circuit apparatus may further comprise: a surface conductive layer formed on the second dielectric layer; and a second via hole buried in the second dielectric layer and connected to the second grounding conductive layer and the surface conductive layer.

Moreover, in a cross section orthogonally intersecting the extension of the signal line, the second grounding conductive layer may be formed inside of the ends of the first and the second dielectric layers.

Furthermore, the signal line may have a region exposed from the first or the second dielectric layer between the cavity and the antenna.

BRIEF DESCRIPTION OF THE DRAWINGS

FIGS. 2(a)–1(c) show a configuration of a microwave and millimeter wave circuit apparatus according to a second embodiment of the present invention.

FIGS. 3(a)–1(c) show a configuration of a microwave and millimeter wave circuit apparatus according to a third embodiment of the present invention.

FIGS. 4(a)–1(c) show a configuration of a microwave and millimeter wave circuit apparatus according to a fourth embodiment of the present invention.

FIGS. 5(a)–1(c) show a configuration of a microwave and millimeter wave circuit apparatus according to a fifth embodiment of the present invention.

FIGS. 6(a)–1(c) show a configuration of a microwave and millimeter wave circuit apparatus according to a sixth embodiment of the present invention.

FIGS. 7(a)–1(c) show a configuration of a conventional microwave and millimeter wave circuit apparatus.

DESCRIPTION OF THE PREFERRED EMBODIMENTS

Description will now be directed to a specific microwave and millimeter wave circuit apparatus including as communication modules, for example, an MMIC having a low noise amplifier as a receiver module and a down converter for converting a signal frequency to an intermediate frequency (IF), and an antenna which are formed as an integration block, with reference to the attached drawing. FIG. 1 shows a configuration of a microwave and millimeter wave circuit apparatus according to a first embodiment of the present invention. FIG. 1(A) is a plan view, FIG. 1(B) is a cross sectional view about the line A—A in FIG. 1(A), and FIG. 1(C) is a cross sectional view about the line B—B in FIG. 1(A).

Figure 1C:
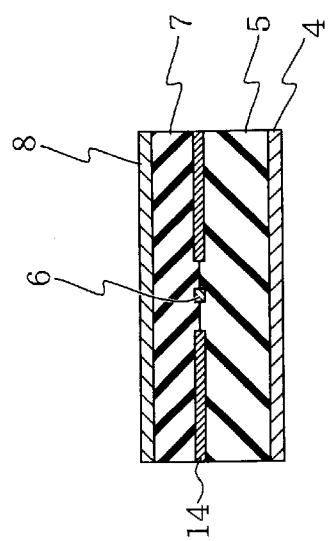
FIGS. 1(a)–1(c) show a configuration of a microwave and millimeter wave circuit apparatus according to a first embodiment of the present invention.
Figure 1A:
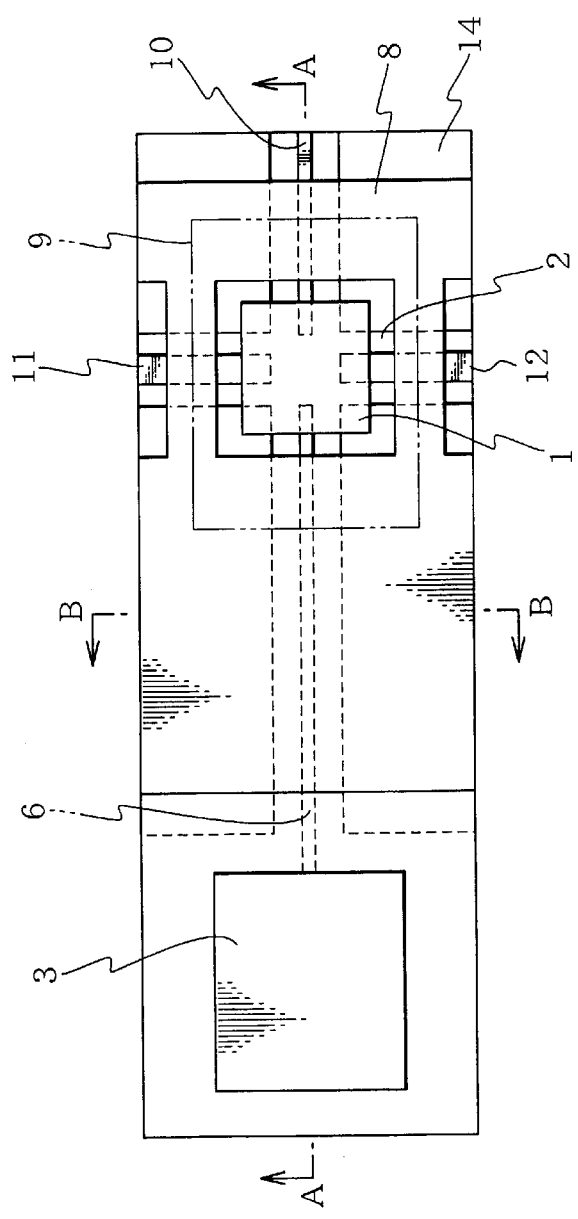
Figure 1B:
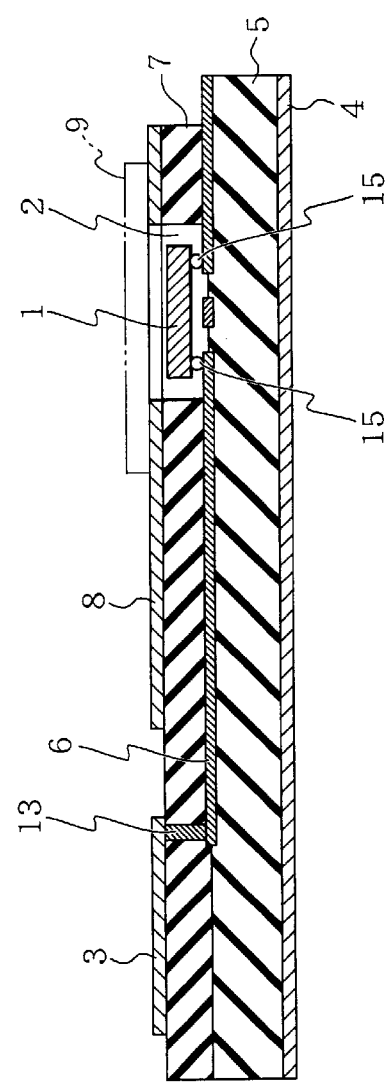

As shown in FIG. 1(A) to FIG. 1(C), in the microwave and millimeter wave circuit apparatus according to the first embodiment, a first dielectric layer 5 is provided on a grounding metal cover 4, and a signal line 6 and a grounding metal cover 14 grounded are selectively formed on the first dielectric layer 5. Furthermore, a second dielectric layer 7 is provided thereon. Here, the dielectric layer is realized through the first dielectric layer 5 and the second dielectric layer 7, and the second dielectric layer 7 is provided with a monolithic microwave integrated circuit (MMIC) and has a cavity 2. In this cavity 2, the MMIC 1 is connected to a signal line 6.

Moreover, an IF output terminal 10 is provided at the right end of the signal line 6 in FIGS. (A) and (B). Furthermore, as other terminals outgoing from the cavity 2, there are provided a bias terminal 11 as the other terminal coming from cavity 2 and a local signal input terminal 12 for introducing to the MMIC 1 a local signal from outside. Moreover, a via hole 13 is buried in the second dielectric layer 7, and through this via hole 13, the patch 3 of the antenna is connected to the RF signal line 6. It should be noted that, although omitted in FIG. 1(A), the cavity 2 is sealed by a cap 9. Moreover, the first dielectric layer 5 serves as a dielectric substrate for the signal line 6 and the antenna patch 3 as well as the mother board of this module. Moreover, the second dielectric layer 7 serves as a protection layer for the signal line 6 and the side material of the cavity 2 for air tight mounting of the MMCI 1 as well as a dielectric layer of the antenna.

In this embodiment having the aforementioned configuration, only by the two dielectric layers, i.e., the first dielectric layer 5 and the second dielectric layer 7, it is possible to realize a microwave and millimeter wave circuit apparatus in which an antenna and a multi-chip mounting cavity which can be air-tightly sealed are formed as an integration block. As a result, it is possible to obtain a small size of apparatus and remarkably reduce the transmission loss.

Moreover, the signal line 6 is a coplanar line type appropriate for flip-chip mounting of the MMIC 1, and the grounding metal cover 14 is provided at both sides of the signal line 6, enabling to connect the MMIC 1 at the shortest distance at once and to easily form a cavity using the second dielectric layer 7.

Furthermore, in this microwave and millimeter wave circuit apparatus, the first dielectric layer 5 serves as the mother board of the module, on which the IF output terminal 10 of coplanar line type and the bias terminal 11 are provided, and the antenna patch 3 is provided further thereon. Accordingly, after mounting the circuit on the stage, it is possible to measure the microwave and millimeter wave characteristics by using a probe apparatus or the like.

Moreover, the dielectric layers may be glass ceramic substrates whose both sides are screen-printed by a metal cover. Furthermore, a via hole is provided in the glass ceramic substrates if necessary. The two of the glass ceramic substrates are superimposed and subjected to a low temperature firing, thus producing the microwave and millimeter wave circuit apparatus of the first embodiment.

Figure 2C:
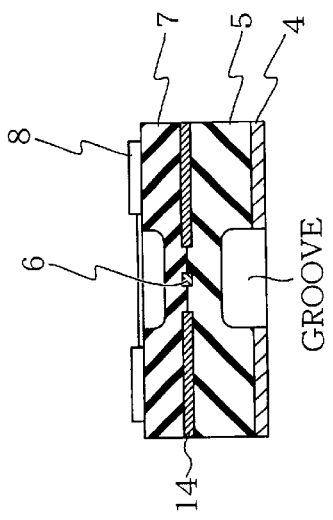
Figure 2A:
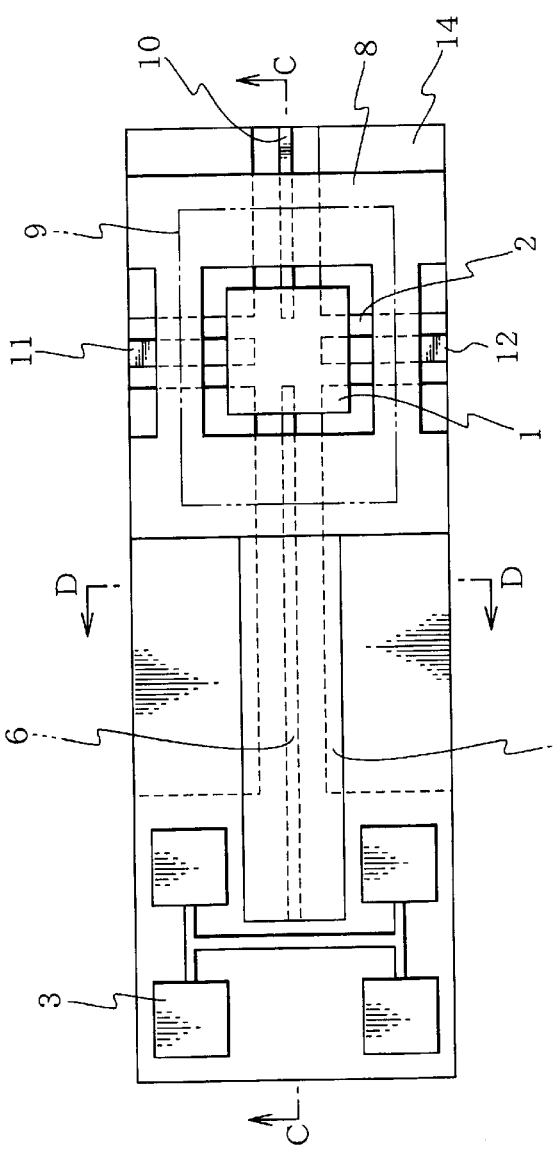
Figure 2B:
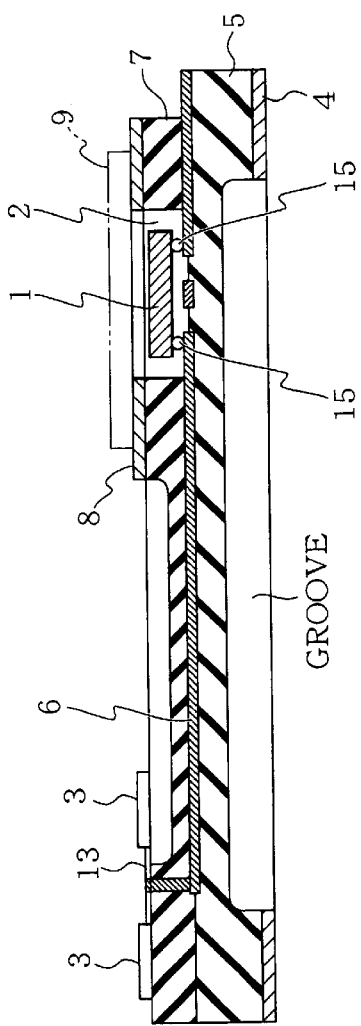

In the aforementioned embodiment, when the RF circuit such as the MMIC and the antenna are formed into a planar integration block, the antenna should have a long supply line and it is necessary to consider how to reduce the loss in this portion. Here, the aforementioned embodiment is improved into a microwave and millimeter wave circuit apparatus according to a second embodiment which will be detailed below with reference to the attached drawings. FIG. 2 shows a configuration of the microwave and millimeter wave circuit apparatus of the second embodiment. FIG. 2(A) is a plan view, FIG. 2(B) is a cross sectional view about the line C—C in FIGS. 2(A), and 2(C) is a cross sectional view about the line D—D in FIG. 2(A). It should be noted that in FIG. 2(A) to FIG. 2(C), like components as in the first embodiment are denoted by like reference symbols and detailed explanation thereof is omitted.

In the second embodiment, as shown in FIG. 2(A) to FIG. 2(C), no grounding metal cover is provided below the signal line 6, and the first dielectric layer 5 has a small thickness. Moreover, in the connection portion between the cavity 2 and the antenna 3, the second dielectric layer 7 has a small thickness.

In the second embodiment having the aforementioned configuration, the grounding metal cover 14 of the coplanar line of the signal line 6 and the lower most layer of the grounding metal cover 4 are in a parallel plate state, which cause generation of radiation mode as well as generation of radiation mode due to the surface wave propagation. Thus, it is possible to reduce the loss of the signal line 6 because no grounding metal cover is provided below the signal line 6. Here, by making the thickness $t_1$ of the first dielectric layer smaller than the value obtained from the Equation 1 given below, it is possible to completely suppress the radiation mode due to the surface wave propagation.

$$c/\{4f(\in_{r_1}-1)^{1/2}\} \qquad \text{[Equation 1]}$$

wherein c is a light velocity, f is the maximum frequency of the transmission signal, and $\in_{r_1}$ represents a relative dielectric constant of the first dielectric layer 5.

Moreover, as a specific example of the embodiment of FIG. 2, the MMIC may be a receiver circuit including a down converter and a coplanar line type low noise amplifier of 60 GHz for example having as an active element AlGaAs/InGaAs hetero junction FET with a 0.15 micrometer gate on a GaAs substrate of 150 micrometer thickness. Moreover, the module substrate is a two-layered glass ceramic substrate having a relative dielectric constant 8 and having a coplanar line type signal line and a bias terminal formed between the layers. In this case, for example, the first dielectric layer 5 has a thickness of 650 micrometers, the second dielectric layer 7 has a thickness of 500 micrometers while the first dielectric layer 5 below the signal line has a thickness of 300 micrometers and the second dielectric layer 7 above the signal line 6 at the connection portion between the cavity 2 and the antenna 3 has a thickness of 150 micrometers. The MMIC1 is flip-chip mounted via an Au bump having a diameter of 80 micrometers and height of 20 micrometers within a cavity of the second dielectric layer of the aforementioned glass ceramic substrate, and the cavity 2 is sealed with a covar plate cap 9 plated with Au. It should be noted that the cap 9 may be a ceramic plate coated with Au.

Figure 3C:
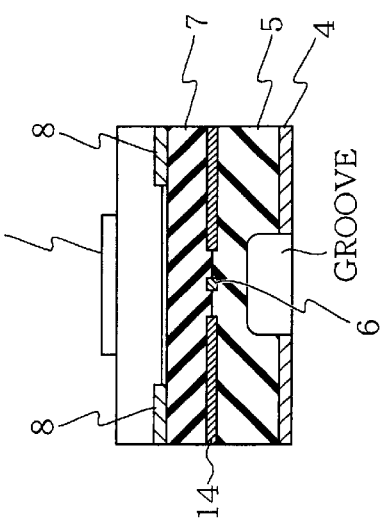
Figure 3A:
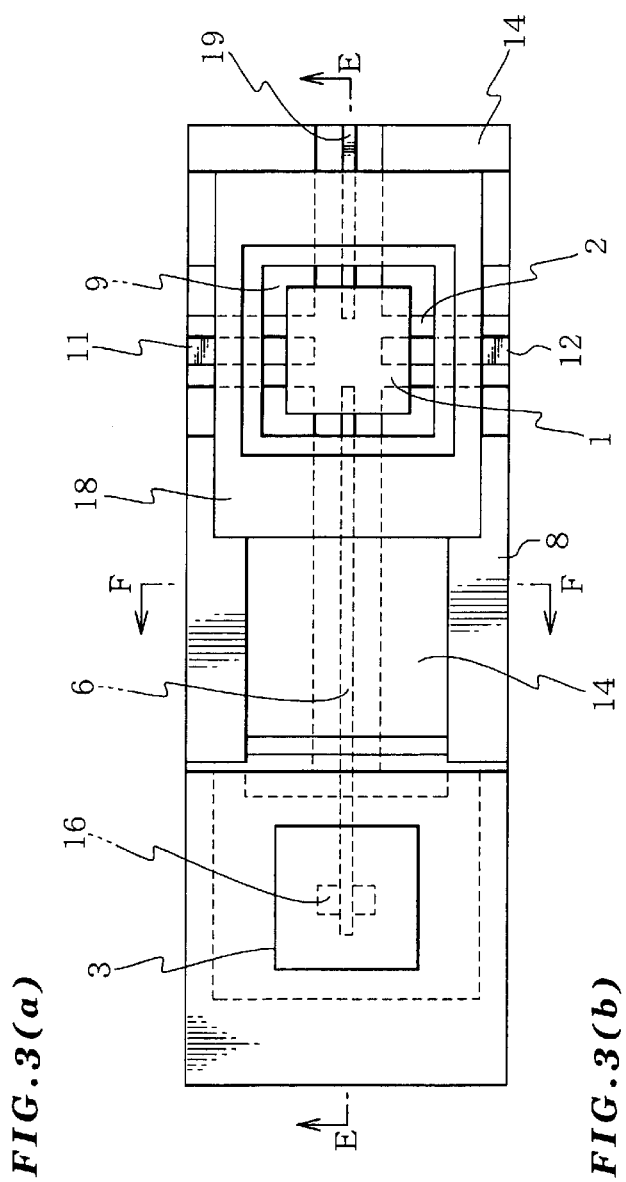
Figure 3B:
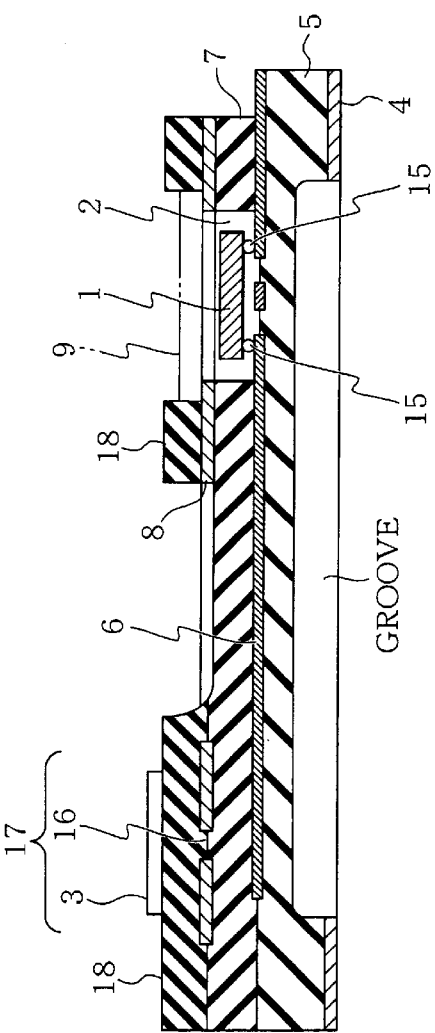

Next, description will be directed to a microwave and millimeter wave circuit apparatus according to a third embodiment of the present invention with reference to the attached drawings. In the third embodiment, as a transmitter module, a transmitter MMIC including an up-converter and an output amplifier and a slot-connected patch antenna are formed into an integration block. FIG. 3 shows a configuration of the microwave and millimeter wave circuit apparatus according to the third embodiment of the present invention. FIG. 3(A) is a plan view, FIG. 3(B) is a cross sectional view about the line E—E in FIG. 3(A), and FIG. 3(C) is a cross sectional view about the line F—F in FIG. 3(A). It should be noted that in the third embodiment shown in FIG. 3(A) to FIG. 3(C), like components as in the first embodiment are denoted by like reference symbols and detailed explanation thereof is omitted.

As shown in FIG. 3(A) to FIG. 3(C), similarly as in the second embodiment, below the signal line 6, no grounding metal cover is provided and the first dielectric layer 5 has a smaller thickness. Moreover, in the connection portion between the cavity 2 and the antenna 17, above the signal line 6, the grounding metal cover 8 on the second dielectric layer 7 is partially removed. This prevents radiation mode caused by the parallel plate state between the grounding metal cover 14 of the coplanar line of the signal line 6 and the metal cover 8 of the uppermost layer, reducing the loss. Here, in order to prevent generation of the radiation mode of parallel plate state, it is effective that the end of the metal cover 8 is apart from the end of the coplanar line grounding metal by twice or more than the distance between the signal line edge and the grounding metal edge. Moreover, in the antenna 17 of the present embodiment, the metal slot 16 on the second dielectric layer 7 is a first radiator and the patch 3 connected thereto is a second radiator.

Moreover, at the right end of the signal line 6, an IF input terminal 19 is provided.

Accordingly, in this embodiment also, only with the two dielectric layers, it is possible to realize a microwave and millimeter wave module including as an integration block the multi-chip mounting cavity 2 which can be sealed air-tightly and a basic portion of the antenna 17. It should be noted that an additional third dielectric layer 18 is used for the antenna and for the cap 9 of the cavity 2.

Figure 4C:
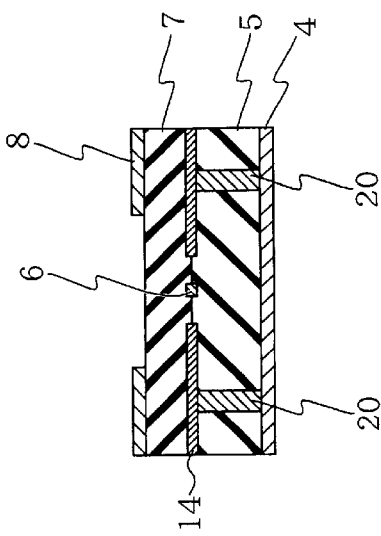
Figure 4A:
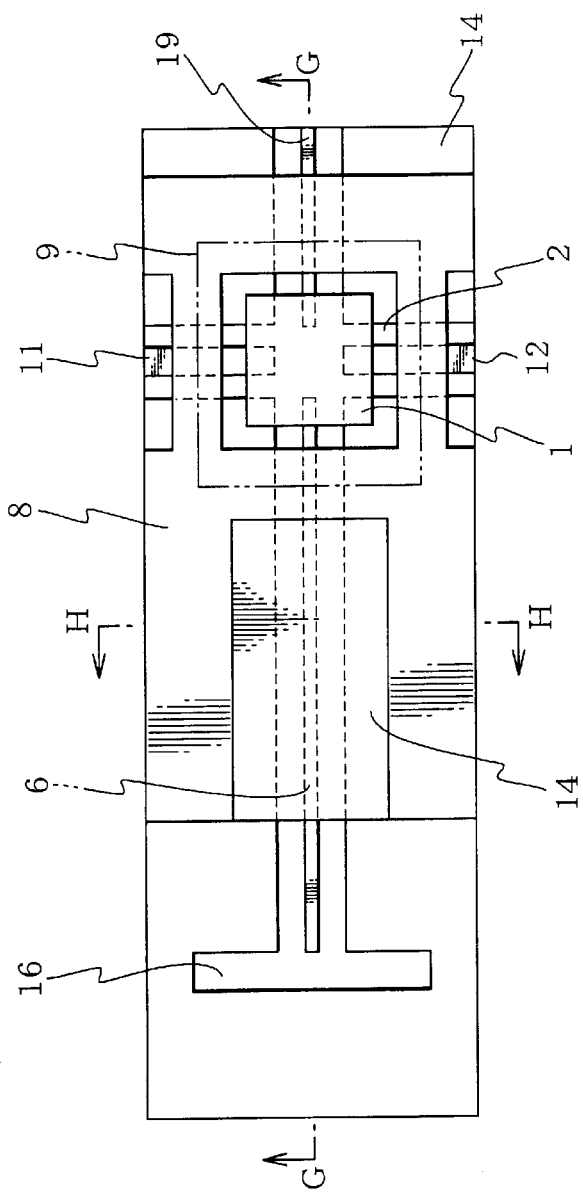
Figure 4B:
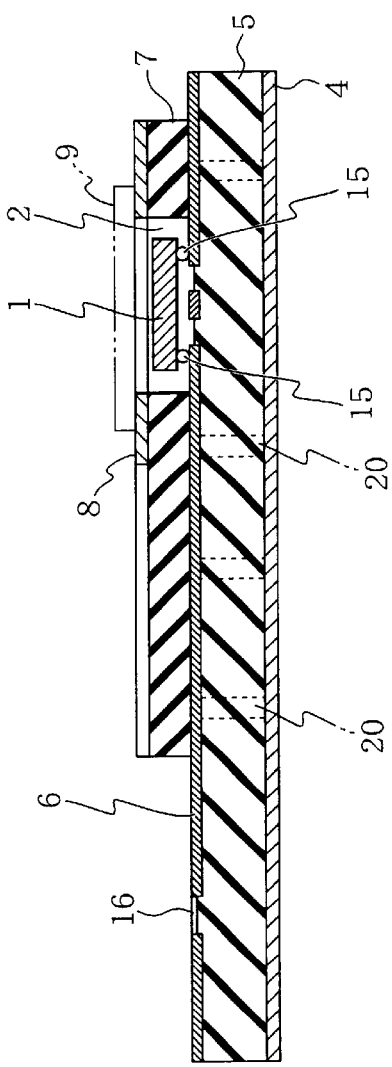

Next, description will be directed to a microwave and millimeter wave circuit apparatus according to a fourth embodiment of the present invention with reference to the attached drawings. In the fourth embodiment, a slot antenna and a transmitter MMIC including a voltage control oscillator for oscillation and frequency modulation and an output amplifier are formed as an integration block as a transmitter module. FIG. 4 shows a configuration of the microwave and millimeter wave circuit apparatus according to the fourth embodiment. FIG. 4(A) is a plan view, FIG. 4(B) is a cross sectional view about the line G—G in FIG. 4(A) and FIG. 4(C) is a cross sectional view about the line H—H in FIG. 4(A). It should be noted that in the fourth embodiment shown in FIG. 4(A) to FIG. 4(C), like components as in the first embodiments are denoted by like reference symbols and detailed explanation thereof is omitted.

As shown in FIG. 4(A) to FIG. 4(C), in this embodiment, a number of via holes 20 are provided between the grounding metal cover 14 and the lowermost grounding metal cover 4, so that the grounding metal cover 14 and the grounding metal cover 4 are connected to each other. The distance between two adjacent via holes 20 is equal to or less than ½ wavelength of the signal propagating through the signal line 6.

In the present embodiment having the aforementioned configuration, the via holes 20 prevent the parallel plate mode by the grounding metal cover 4 and the grounding metal cover 14, thus preventing the radiation mode.

Figure 5C:
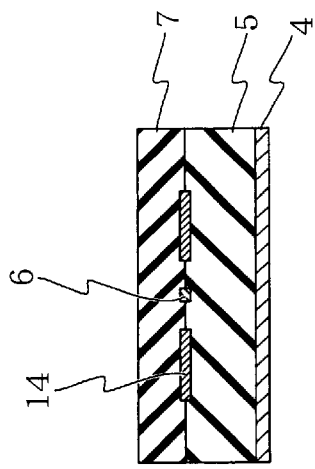
Figure 5A:
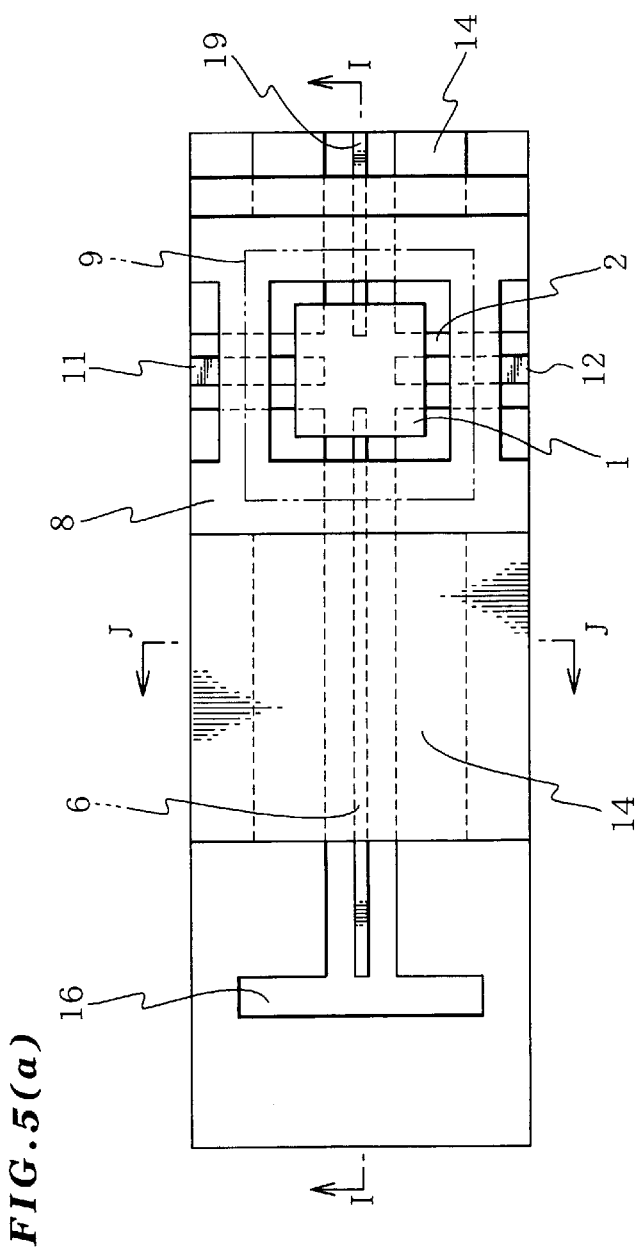
Figure 5B:
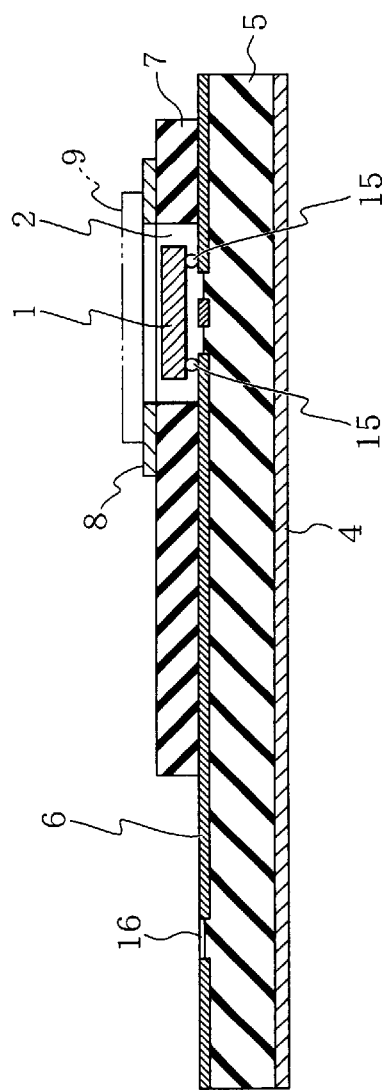

Next, description will directed to a microwave and millimeter wave circuit apparatus according to a fifth embodiment of the present invention with reference to the attached drawings. In the fifth embodiment, similarly as in the fourth embodiment, as a transmitter module, the slot antenna and the transmitter MMIC including the voltage control oscillator for oscillation and frequency modulation and the output amplifier are formed in an integration block. FIG. 5 shows a configuration of the microwave and millimeter wave circuit apparatus according to the fifth embodiment of the present invention. FIG. 5(A) is a plan view, FIG. 5(B) is a cross sectional view about the line I—I in FIG. 5(A), and FIG. 5(C) is a cross sectional view about the line J—J in FIG. 5(A). It should be noted that in the fifth embodiment shown in FIG. 5(A) to FIG. 5(C), like components as in the first embodiment are denoted by like reference symbols and detailed explanation thereof is omitted.

As shown in FIG. 5(A) to FIG. 5(C), in the microwave and millimeter wave circuit apparatus according to the present embodiment, the grounding metal cover 14 of a coplanar line of the signal line 6 is formed, only inside of the first dielectric layer 5 and the second dielectric layer 7, which are the module substrates, in a direction vertical to the propagation direction.

In the present embodiment having the aforementioned configuration, it is possible to eliminate the parallel plate mode between the grounding metal cover 14 and the lowermost grounding metal cover 4, thus reducing the signal line transmission loss. Furthermore, the second dielectric layer entirely has a reduced thickness, so as to eliminate generation of the radiation mode by the surface wave propagation.

Figure 6C:
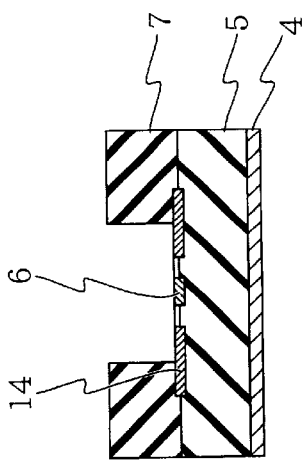
Figure 6A:
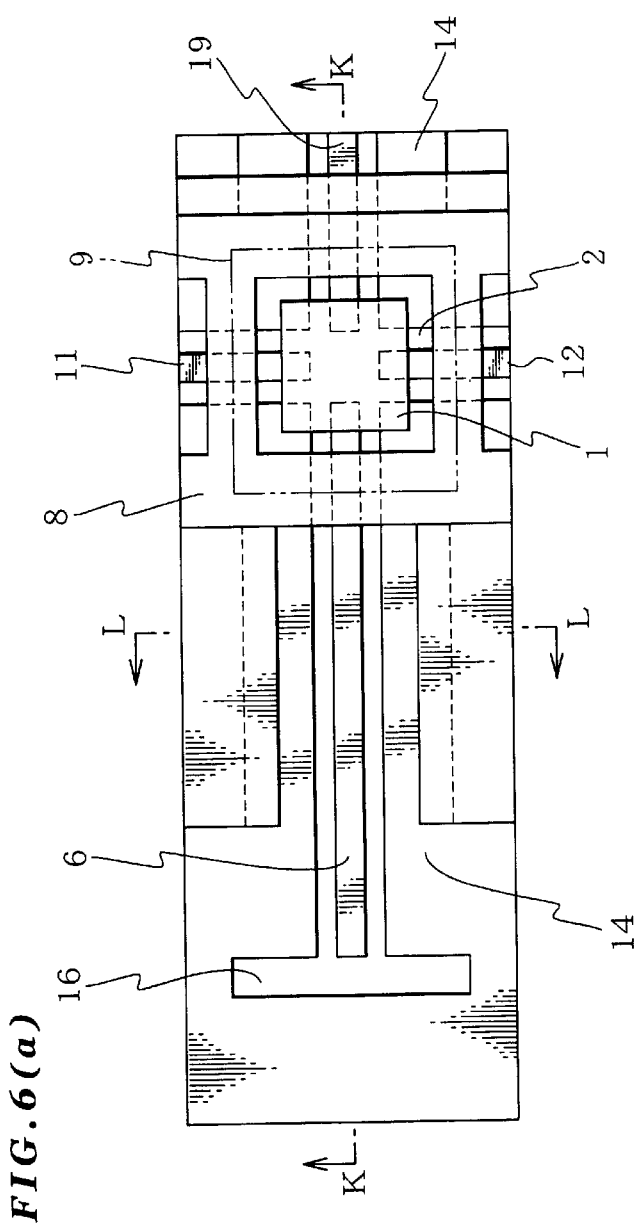
Figure 6B:
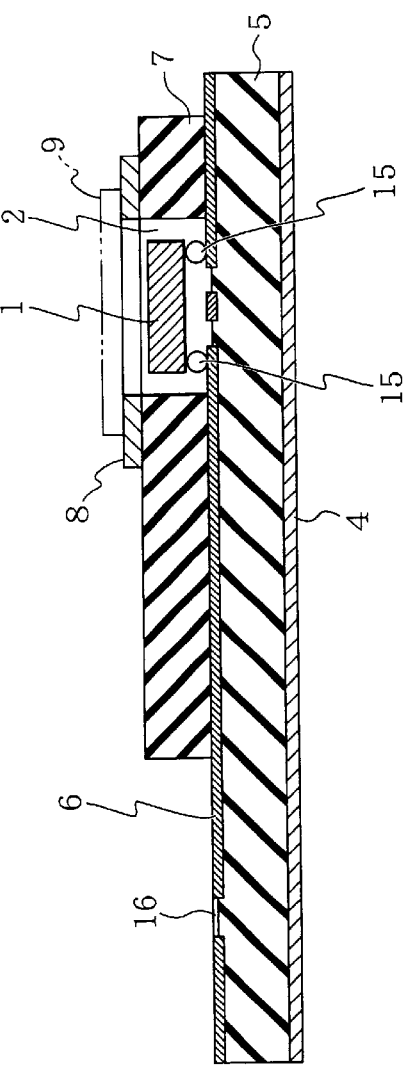
Figure 8:
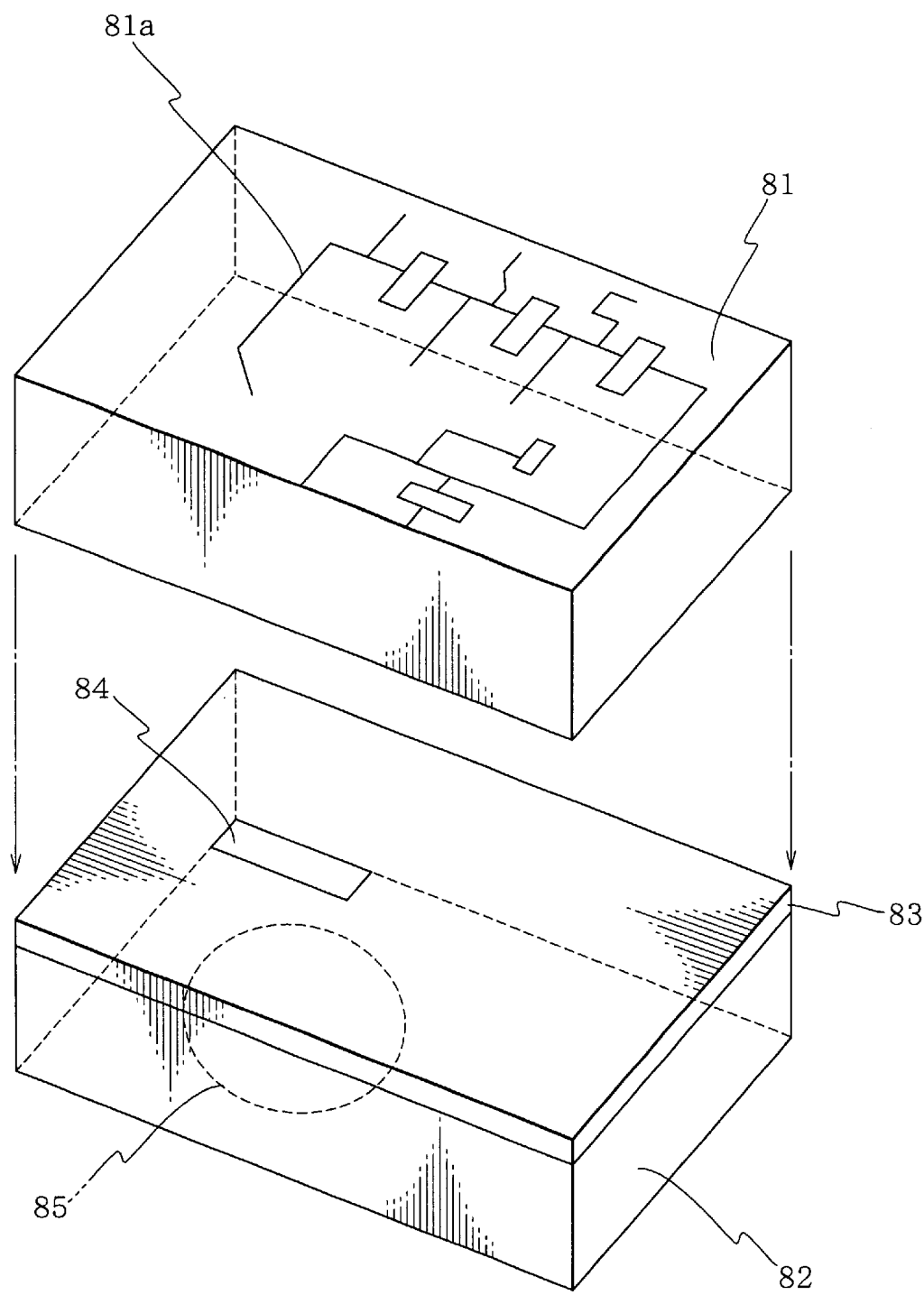
FIG. 8 schematically shows a configuration of a conventional microwave and millimeter wave circuit apparatus using a GaAs substrate.

Next, description will be directed to a microwave and millimeter wave circuit apparatus according to a sixth embodiment of the present invention with reference to the attached drawings. In the sixth embodiment, similarly as in the fifth embodiment, a slot antenna and a transmitter MMIC including a voltage control oscillator for oscillation and frequency modulation and an output amplifier are formed as an integration block as a transmitter module. FIG. 6 shows a configuration of the microwave and millimeter wave circuit apparatus according to the sixth embodiment. Similarly as FIG. 5, for example, a transmitter module is realized by a slot antenna and a transmitter MMIC including a voltage control oscillator for oscillation and frequency modulation and an output amplifier which are formed as an integration block. FIG. 6(A) is a plan view, FIG. 6(B) is a cross sectional view about the line K—K in FIG. 6(A), and FIG. 6(C) is a cross sectional view about the line L—L in FIG. 6(A). It should be noted that in the sixth embodiment shown in FIG. 6(A) to FIG. 6(C), like components as in the first embodiment are denoted by like reference symbols and detailed explanation thereof is omitted.

As shown in FIG. 6(A) to FIG. 6(C), the cavity 2 is further deepened. That is, in order to prevent the radiation mode caused by a surface wave propagation when the second dielectric layer 7 is thick, no second dielectric layer is provided above the signal line 6 connecting the cavity 2 to the antenna 3.

In this embodiment having the aforementioned configuration also, the transmission loss is reduced.

It should be noted that it is also possible that no first dielectric layer is provided below the signal line 6.

Moreover, in the aforementioned embodiments, explanation has been given on a case that the module including the antenna is used solely for transmitter and receiver. However, the present invention is not to be limited to this. For example, the present invention can be applied to a microwave and millimeter wave circuit apparatus including transmitter-receiver MMIC as an integration block, and to a microwave and millimeter wave circuit apparatus including as an integration block: transmitter circuit cavity and receiver circuit cavity; a transmitter antenna and a receiver antenna or a transmitter-receiver antenna; and a circulator. Moreover, on the bias line of the first dielectric layer, there may be provided a bias circuit including a resistor, capacitor, an inductor, and the like. In this case, the bias circuit in the MMIC may be simplified. Furthermore, around the cavity, a bias line may be provided in the first and the second dielectric layers.

As has been detailed above, according to the present invention, it is possible to perform mass production of a microwave and millimeter wave receiver module including as an integration block an antenna and MMIC which can be air-tightly sealed with two dielectric layers. This enables mass production of communication and radar apparatuses, realizing a reduction in production costs. Moreover, since the MMIC and the antenna are formed as an integration block, it is possible to reduce the size of the entire apparatus.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-080621 (Filed on Mar. 24$^{th}$, 1999) including specification, claims, drawings and summary are incorporated herein by reference in its entirety.

What is claimed is:

1. A microwave and millimeter wave circuit apparatus comprising:

a grounding conductive layer grounded;

a first dielectric layer formed on the grounding conductive layer;

a signal line formed selectively on the first dielectric layer;

a second dielectric layer coveting at least a part of the signal line;

a cavity formed in the second dielectric layer and extending to the signal line;

a monolithic microwave integrated circuit arranged in the cavity and connected to the signal line; and an antenna connected to the signal line.

2. The microwave and millimeter wave circuit apparatus as claimed in claim 1, wherein the monolithic microwave integrated circuit is flip-chip mounted.

3. The microwave and millimeter wave circuit apparatus as claimed in claim 1, wherein the first dielectric layer has a thickness smaller than a value obtained by $c/(4f \cdot (\in_1 - 1)^{1/2})$ wherein $\in_1$ is a relative dielectric constant of the first dielectric layer, f is a frequency of the signal propagating in the signal line, and c is a light velocity.

4. The microwave and millimeter wave circuit apparatus as claimed in claim 1, wherein the second dielectric layer has a thickness smaller than a value obtained by $c/(4f \cdot (\in_2 - 1)^{1/2})$ wherein $\in_2$ is a relative dielectric constant of the second dielectric layer, f is a frequency of the signal propagating in the signal line, and c is a light velocity.

5. The microwave and millimeter wave circuit apparatus as claimed in claim 1, wherein the second dielectric layer has at least a portion where no metal cover is provided.

6. The microwave and millimeter wave circuit apparatus as claimed in claim 1, the signal line has a region exposed from the first or the second dielectric layer between the cavity and the antenna.

7. A microwave and millimeter wave circuit apparatus comprising:

a grounding conductive layer grounded;

a first dielectric layer formed on the grounding conductive layer;

a signal line formed selectively on the first dielectric layer;

a second dielectric layer covering at least a part of the signal line;

a cavity formed in the second dielectric layer and extending to the signal line;

a monolithic microwave integrated circuit arranged in the cavity and connected to the signal line; and an antenna connected to the signal line, the apparatus further comprising two second grounding conductive layers formed so as to sandwich the signal line on the first dielectric layer and grounded, wherein the signal line and the two grounding conductive layers constitute a coplanar line.

8. The microwave and millimeter wave circuit apparatus as claimed in claim 7, wherein the monolithic microwave integrated circuit is flip-chip mounted.

9. The microwave and millimeter wave circuit apparatus as claimed in claim 7, wherein the first dielectric layer has a thickness smaller than a value obtained by $c/(4f \cdot (\in_1 - 1)^{1/2})$ wherein $\in_1$ is a relative dielectric constant of the first dielectric layer, f is a frequency of the signal propagating in the signal line, and c is a light velocity.

10. The microwave and millimeter wave circuit apparatus as claimed in claim 7, wherein the second dielectric layer has a thickness smaller than a value obtained by $c/(4f \cdot (\in_2 - 1)^{1/2})$ wherein $\in_2$ is a relative dielectric constant of the second dielectric layer, f is a frequency of the signal propagating in the signal line, and c is a light velocity.

11. The microwave and millimeter wave circuit apparatus as claimed in claim 7, wherein a groove is formed in the first dielectric layer, and the first dielectric layer in the region of the groove has a thickness smaller than a value obtained from equation $c/(4f \cdot (\in_{r_1}-1)^{1/2})$ wherein $\in_{r_1}$ is a relative dielectric constant of the first dielectric layer, f is the maximum frequency of the signal propagating in the signal line, and c is the light velocity.

12. The microwave and millimeter wave circuit apparatus as claimed in claim 7, wherein a second groove is formed in the second dielectric layer, and the second dielectric layer in the region of the second groove has a thickness smaller than a value obtained from equation $c/(4f \cdot (\in_{r_2}-1)^{1/2})$ wherein $\in_{r_2}$ is a relative dielectric constant of the second dielectric layer, f is the maximum frequency of the signal propagating in the signal line, and c is the light velocity.

13. The microwave and millimeter wave circuit apparatus as claimed in claim 7, the apparatus further comprising a via hole buried in the first dielectric layer and connected to the grounding conductive layer and to the second grounding conductive layer.

14. The microwave and millimeter wave circuit apparatus as claimed in claim 7, wherein the second dielectric layer has at least a portion where no metal cover is provided.

15. The microwave and millimeter wave circuit apparatus as claimed in claim 7, the apparatus further comprising:
   a surface conductive layer formed on the second dielectric layer; and
   a second via hole buried in the second dielectric layer and connected to the second grounding conductive layer and the surface conductive layer.

16. The microwave and millimeter wave circuit apparatus as claimed in claim 7, wherein in a cross section orthogonally intersecting the extension of the signal line, the second grounding conductive layer is formed inside of the ends of the first and the second dielectric layers.

17. The microwave and millimeter wave circuit apparatus as claimed in claim 7, the signal line has a region exposed from the first or the second dielectric layer between the cavity and the antenna.

18. A microwave and millimeter wave circuit apparatus comprising:
   a grounding conductive layer grounded;
   a first dielectric layer formed on the grounding conductive layer;
   a signal line formed selectively on the first dielectric layer;
   a second dielectric layer covering at least a part of the signal line;
   a cavity formed in the second dielectric layer and extending to the signal line;
   a monolithic microwave integrated circuit arranged in the cavity and connected to the signal line; and
   an antenna connected to the signal line,
   wherein further a groove is formed in the first dielectric layer, and the first dielectric layer in the region of the groove has a thickness smaller than a value obtained from equation $c/(4f \cdot (\in_{r_1}-1)^{1/2})$ wherein $\in_{r_1}$ is a is a relative dielectric constant of the first dielectric layer, f is the maximum frequency of the signal propagating in the signal line, and c is the light velocity.

19. A microwave and millimeter wave circuit apparatus comprising:
   a grounding conductive layer grounded;
   a first dielectric layer formed on the grounding conductive layer;
   a signal line formed selectively on the first dielectric layer;
   a second dielectric layer covering at least a part of the signal line;
   a cavity formed in the second dielectric layer and extending to the signal line;
   a monolithic microwave integrated circuit arranged in the cavity and connected to the signal line; and
   an antenna connected to the signal line,
   wherein further a second groove is formed in the second dielectric layer, and the second dielectric layer in the region of the second groove has a thickness smaller than a value obtained from equation $c/(4f \cdot (\in_{r_1}-1)^{1/2})$ wherein $\in_{r_1}$ is a relative dielectric constant of the second dielectric layer, f is the maximum frequency of the signal propagating in the signal line, and c is the light velocity.

* * * * *